United States Patent
Kuehne et al.

(10) Patent No.: US 6,372,605 B1
(45) Date of Patent: Apr. 16, 2002

(54) ADDITIONAL ETCHING TO DECREASE POLISHING TIME FOR SHALLOW-TRENCH ISOLATION IN SEMICONDUCTOR PROCESSING

(75) Inventors: Stephen C. Kuehne; Alvaro Maury; Scott F. Shive, all of Orlando, FL (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/603,340

(22) Filed: Jun. 26, 2000

(51) Int. Cl.$^7$ ............................................. H01L 21/76
(52) U.S. Cl. ........................ 438/427; 438/424; 257/510
(58) Field of Search ................................ 438/296, 424, 438/427; 257/510

(56) References Cited

U.S. PATENT DOCUMENTS

| | | | | |
|---|---|---|---|---|
| 4,352,724 A | * | 10/1982 | Sugishima et al. | 204/192 E |
| 5,851,899 A | * | 12/1998 | Weigand | 438/427 |
| 5,923,993 A | * | 7/1999 | Sahota | 438/427 |
| 6,004,863 A | * | 12/1999 | Jang | 438/427 |
| 6,043,133 A | * | 3/2000 | Jang et al. | 438/424 |
| 6,048,771 A | * | 4/2000 | Lin et al. | 438/296 |
| 6,048,775 A | * | 4/2000 | Yao et al. | 438/427 |
| 6,057,210 A | * | 5/2000 | Yang et al. | 438/427 |
| 6,071,792 A | * | 6/2000 | Kim et al. | 438/424 |
| 6,124,183 A | * | 6/2000 | Karlsson et al. | 438/427 |
| 6,150,072 A | * | 11/2000 | Shoda et al. | 438/424 |
| 6,159,822 A | * | 12/2000 | Yang et al. | 438/427 |
| 6,171,929 B1 | * | 1/2001 | Yang et al. | 438/427 |
| 6,169,012 B1 | * | 2/2001 | Chen et al. | 438/427 |

FOREIGN PATENT DOCUMENTS

| | | | | |
|---|---|---|---|---|
| DE | 010011642 A1 | * | 10/2000 | H01L/21/762 |
| JP | 164690 A | * | 6/2000 | H01L/21/76 |

* cited by examiner

Primary Examiner—Charles Bowers
Assistant Examiner—David S Blum
(74) Attorney, Agent, or Firm—Steve Mendelsohn (57) ABSTRACT

During formation of shallow-trench isolation (STI) structures during semiconductor processing, an additional oxide-reduction etching step is performed prior to chemical-mechanical processing. In one implementation wet-etching and/or sputter etch-back (SEB) is performed prior to applying a reverse-tone mask. In another implementation a wet etching step is performed after the reverse-tone mask is stripped. One significant result of each of these steps is a reduction in the height and width of at least some of the oxide horns that remain after the reverse-tone mask is stripped. As such, the oxide structures that need to be planarized during CMP will be smaller than those of the prior art. Moreover, since the resulting oxide structures that need to be planarized by CMP processing are smaller, the oxide layer can be initially applied at a smaller thickness than that of the prior art. As such, the duration of CMP processing can be correspondingly shorter, resulting in polished semiconductor wafer surfaces with greater uniformity than that provided by the prior art.

19 Claims, 9 Drawing Sheets

ADDITIONAL ETCHING TO DECREASE POLISHING TIME FOR SHALLOW-TRENCH ISOLATION IN SEMICONDUCTOR PROCESSING

CROSS-REFERENCE TO RELATED APPLICATIONS

The subject matter of this application is related to U.S. patent application Ser. No. 09/603,335 filed Jun. 26, 2000.

BACKGROUND OF THE INVENTION

1. Field of the Invention

The present invention relates to the field of semiconductor processing, and, more particularly, to forming shallow-trench isolation structures during semiconductor processing.

2. Description of the Related Art

The fabrication of integrated circuits typically involves placing numerous devices on a single semiconductor substrate. Isolation structures are used to electrically isolate one device from another. Isolation structures define field regions of the semiconductor substrate, and the device areas define active regions. Individual devices may then be interconnected by running conducting lines over the isolation structures.

A popular isolation technology used in integrated circuits involves the process of locally oxidizing silicon. Local oxidation of silicon, or LOCOS processing, involves oxidizing field regions between device active regions. The oxide grown in field regions is termed field oxide. Field oxide is grown during the initial stages of integrated circuit fabrication before the gate conductor and source/drain regions are formed in active regions. By growing a thick field oxide in isolating field regions pre-implanted with a channel-stop dopant, LOCOS processing serves to prevent the establishment of parasitic channels in the field regions.

While LOCOS processing has remained a popular isolation technology, there are several inherent problems. First, during fabrication, field oxide can extend beyond the field region to form oxide structures that, in many instances, can encroach unacceptably into the device active regions. Second, the pre-implanted channel-stop dopant often redistributes during the high temperatures associated with field oxide growth. Redistribution of channel-stop dopant primarily affects the active region periphery causing problems known as narrow-width effects. Third, the thickness of field oxide can cause large height disparities across the semiconductor topography between field regions and active regions. Topological disparities can cause planarity problems that can become severe as circuit-critical dimensions shrink. Lastly, field oxide is typically significantly thinner in small field regions (i.e., field regions of small lateral dimension) than in field regions with relatively large lateral dimensions, resulting in undesirable variations in field-oxide thickness for differently sized field regions. Despite advances made to decrease the occurrences of oxide structures encroaching into active regions, channel-stop encroachment, non-planarity, and variable field-oxide thickness, it appears that LOCOS technology is still inadequate for deep sub-micron technologies.

Many of the problems associated with LOCOS technology are alleviated by an isolation technique known as shallow-trench isolation (STI). The STI process is better suited than LOCOS technology for isolating densely spaced active devices using field regions less than, e.g., 3.0–5.0 microns in the lateral dimension. Narrow-width STI structures may be used to isolate densely spaced devices, and larger width STI structures may be used to isolate devices that are spaced further apart.

The shallow-trench isolation process involves the steps of etching a silicon substrate to a relatively shallow depth, e.g., between 0.2 to 0.5 microns, and then filling the shallow trench with a deposited dielectric. Some STI processes include an interim step of growing oxide on the trench walls prior to filling the trench with the dielectric. The trench dielectric may comprise decomposed tetraethyl-orthosilicate ("TEOS") deposited using a high-density plasma chemical vapor deposition ("HDPCVD") process. The HDPCVD process may, for example, be performed at approximately 400–600° C. in a chamber at either atmospheric or low pressure.

Figure 1A:
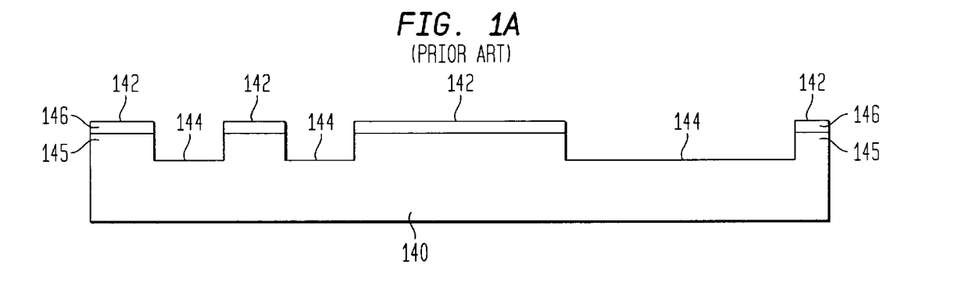
FIGS. 1A–E are cross-sectional views showing a conventional method of forming shallow-trench isolation (STI) structures on a semiconductor substrate.
Figure 1B:
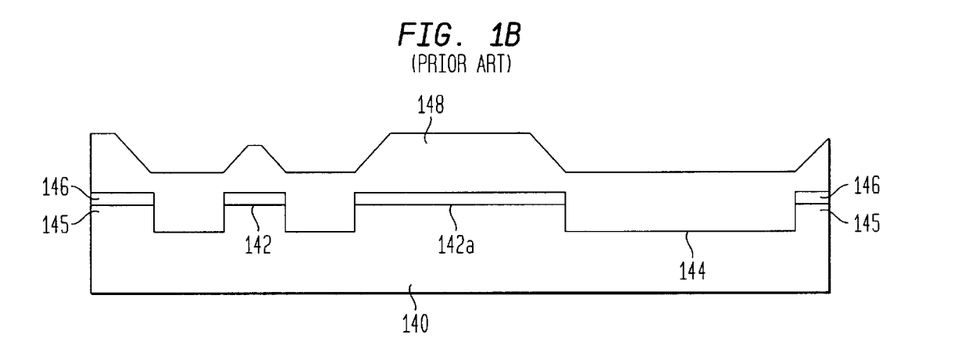

FIGS. 1A–E show a conventional method of forming shallow-trench isolation structures. In FIG. 1A, active regions 142, comprising a pad oxide 145 and a silicon nitride layer 146, are formed on a substrate 140. Using photolithography and etching, the pad oxide 145, the silicon nitride layer 146, and a part of the substrate 140 are selectively removed to form shallow trenches 144 between the active regions 142. In FIG. 1B, using an HDPCVD process, an oxide layer 148 is formed over the substrate 140. Due to the shallow trenches 144, the oxide layer 148 formed by the HDPCVD process has a profile in which pyramid-like oxide horns are formed on the active regions 142.

Figure 1C:
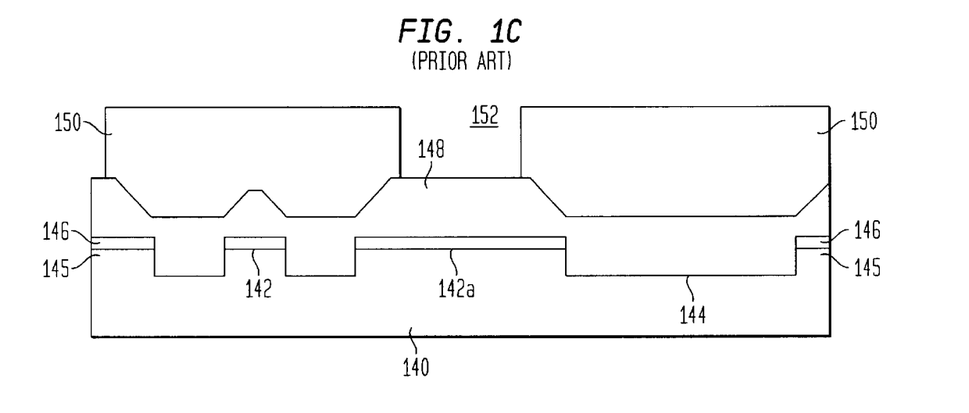

In FIG. 1C, a photo-resist layer is formed on the oxide layer 148. Using photolithography, the photo-resist layer is selectively removed to define a reverse-tone active mask 150 having openings (e.g., 152) formed over large (i.e., wide) active regions (e.g., 142a) that expose the oxide layer 148. Active regions that are narrower than a certain critical dimension (e.g., about 0.9 microns), do not get exposed by the reverse-tone mask. Since only the oxide layer 148 on the central part of the large active regions is exposed through the mask openings, the oxide layer 148 on the shallow trenches 144 is not exposed.

Figure 1D:
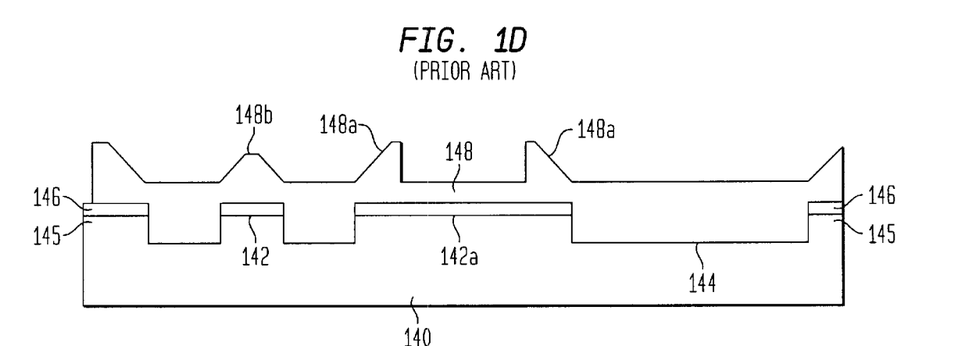

In FIG. 1D, the exposed oxide layer 148 within the opening 152 is dry-etched back by an amount roughly equal to the total trench step height (including the pad oxide and silicon nitride layer), and the reverse-tone mask 150 is then stripped (i.e., removed), leaving oxide structures 148b on top of the small (i.e., narrow) active regions 142 and oxide structures 148a on top of the large active regions 142a.

Figure 1E:
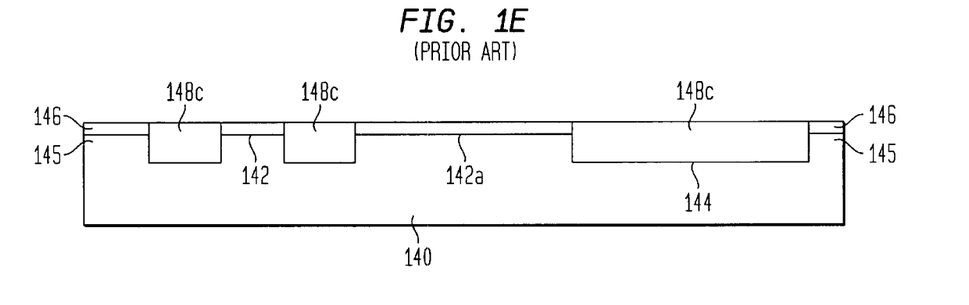

In FIG. 1E, using chemical-mechanical polishing (CMP), the oxide layer 148 including oxide horns 148a and 148b are planarized with the silicon nitride layer 146 as an etch stop, so that the remaining oxide regions 148c within the shallow trenches 144 have the same level as the silicon nitride regions 146. FIG. 1E shows an idealized result in which CMP processing removes excess, unwanted material from the semiconductor wafer to create a uniform planarized surface.

Prior art shallow-trench isolation techniques, such as that shown in FIGS. 1A–E, have certain disadvantages. In prior art STI techniques, the oxide layer (e.g., layer 148 in FIG. 1B formed by an HDPCVD process) over the substrate must be thick enough to ensure that there is enough margin during CMP processing to planarize the oxide layer (i.e., remove the oxide horns) before the silicon nitride layer (e.g., layer 146 in FIG. 1E) is reached in order to provide uniform polishing of the entire wafer surface. For the prior art, this implies that the HDPCVD oxide layer 148 of FIG. 1B must be at least about 1.5–2.0 times the total trench step height (i.e., substrate trench depth plus thicknesses of the pad oxide and silicon nitride layer). For example, for a trench depth of 0.3 microns and a silicon nitride layer thickness of 0.12 microns, a typical HDPCVD oxide layer 148 is about 0.7 microns thick, which is about 3–4 kÅ more than the trench step height (where 1 micron equals 10 kÅ).

Thicker oxide layers require more polishing to remove excess matter, which lengthens the CMP processing times of FIG. 1E. Furthermore, post-CMP non-uniformity worsens with longer polishing, since, among other factors, temperature variations across the wafer tend to increase with time during polishing and the removal rate of oxide is a strong function of wafer surface temperature. Other sources of variation include localized wafer regions that are thicker than the rest, leading to "hot spots," and/or variations in wafer shape during polishing because of stress changes as layers are removed. All of these effects tend to become more severe during longer durations of polishing, resulting in a non-uniform wafer surface after polishing.

SUMMARY OF THE INVENTION

The present invention is directed to techniques for achieving more uniform semiconductor wafers during fabrication of shallow-trench isolation (STI) structures by enabling shorter durations for chemical-mechanical polishing (CMP). According to the present invention, during an STI process, the wafer is subjected to an additional oxide-reduction etching step prior to CMP processing. In one implementation wet-etching and/or sputter etch-back (SEB) is performed prior to applying the reverse-tone mask. In another implementation a wet etching step is performed after the reverse-tone mask is stripped. One significant result of each of these steps is a reduction in the height and width of at least some of the oxide horns that remain after the reverse-tone mask is stripped. As such, the oxide structures that need to be planarized during CMP will be smaller than those of the prior art (e.g., structures 148a and 148b in FIG. 1D). Moreover, since the resulting oxide structures that need to be planarized by CMP processing are smaller, the oxide layer can be initially applied at a smaller thickness than that of the prior art (e.g., oxide layer 148 in FIG. 1B). As such, the duration of CMP processing can be correspondingly shorter, resulting in polished semiconductor wafer surfaces with greater uniformity than that provided by the prior art.

In one embodiment, the present invention is a method for forming shallow-trench isolation structures during semiconductor processing, comprising the sequence of steps of (a) forming shallow trenches in a substrate; (b) applying a silicon oxide layer onto the substrate; (c) applying a reverse-tone mask over the silicon oxide layer, wherein the reverse-tone mask has openings that expose the silicon oxide layer corresponding to large active regions of the substrate; (d) dry-etching the silicon oxide layer exposed through the openings in the reverse-tone mask; (e) stripping the reverse-tone mask; and (f) performing chemical-mechanical polishing to generate a planarized substrate having STI structures, wherein wet-etching is performed prior to the CMP polishing to reduce the sizes of oxide structures in the silicon oxide layer.

In another embodiment, the present invention is a method for forming shallow-trench isolation structures during semiconductor processing, comprising the sequence of steps of (a) forming shallow trenches in a substrate; (b) applying a silicon oxide layer onto the substrate; (c) performing a sputter etch-back to pull back sloped edges in the silicon oxide layer; (d) applying a reverse-tone mask over the silicon oxide layer, wherein the reverse-tone mask has openings that expose the silicon oxide layer corresponding to large active regions of the substrate; (e) dry-etching the silicon oxide layer exposed through the openings in the reverse-tone mask; (f) stripping the reverse-tone mask; and (g) performing chemical-mechanical polishing to generate a planarized substrate having STI structures.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

FIGS. 2A–F, 4A–E, and 5A–F illustrate methods of forming shallow-trench isolation structures according to three different embodiments of the present invention. In general, the processing steps indicated in these figures are similar to those illustrated in FIGS. 1A–E, with the various layers and structures labeled analogously, with the following significant differences. In each of these three methods, an in situ plasma sputter etch-back (SEB) step is applied prior to the application of the reverse-tone mask to preferentially sputter away oxide on the sloped edges of the oxide horns, and the reverse-tone mask exposes at least part of the sloped edges of the oxide structures over large active regions. In addition, in the STI process of FIGS. 2A–F, an additional wet-etching step is applied after the reverse-tone mask is stripped. In the STI processes of FIGS. 4A–E and FIGS. 5A–F, a highly selective dry-etching step is applied to the reverse-tone mask. In addition, in the STI process of FIGS. 5A–F, an additional wet-etching step is applied prior to the application of the reverse-tone mask.

Figure 2A:
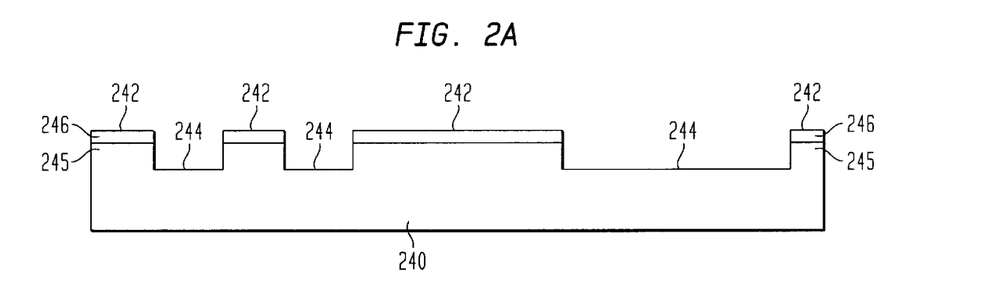
FIGS. 2A–F are cross-sectional views showing a method of forming STI structures, in accordance with a first embodiment of the present invention.
Figure 2B:
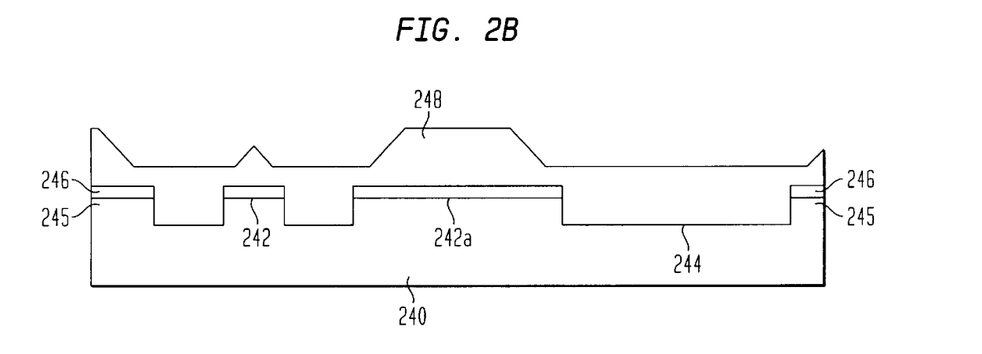
Figure 2C:
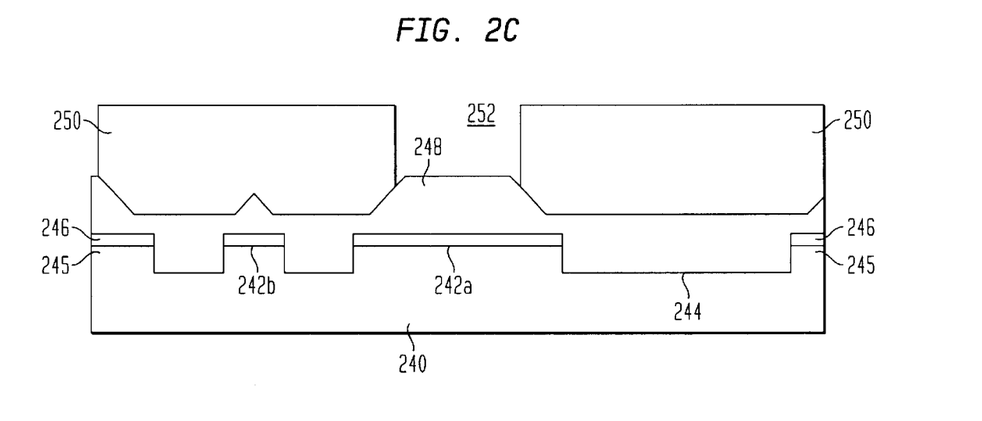

Referring to the STI process of FIGS. 2A–F, after the shallow trenches 244 are formed (FIG. 2A), the oxide layer 248 is formed over the substrate 240 using a modified HDPCVD oxide deposition step with an additional in situ sputter etch-back (SEB) operation at the end of the deposition cycle (FIG. 2B). The SEB step preferentially sputters away oxide on sloped edges to pull the sloped edges of the oxide layer away from the active region edges (e.g., by about 0.2 microns). A reverse-tone mask 250 with a small compensation (e.g., less than about 0.25 micron) is then formed with openings (e.g., 252) exposing large active regions (e.g., 242a) (FIG. 2C). Because the SEB step pulled the sloped edges of the oxide layer away from the active regions edges, the reverse-tone mask 250 can be formed such that opening 252 exposes at least part of the sloped edges of the oxide layer over large active region 242a in addition to the "flat plateau" over the center of that region.

Figure 2D:
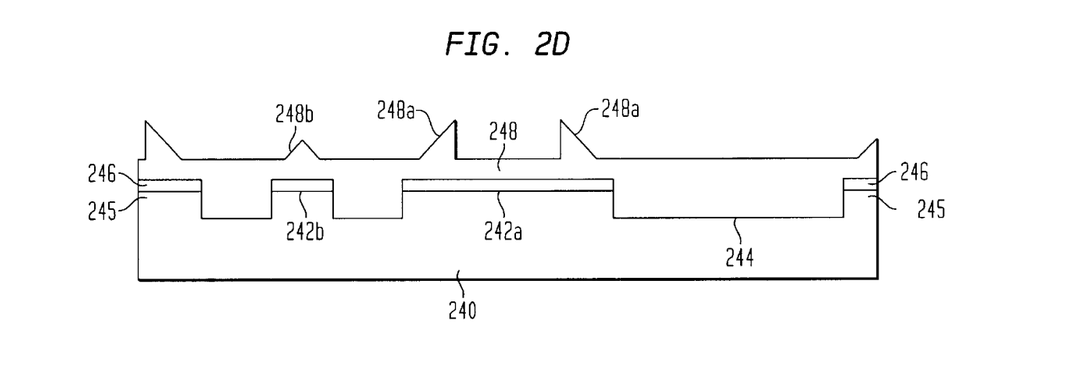

In FIG. 2D, the exposed oxide layer 248 within the openings (e.g., 252) is etched back by an amount roughly equal to the total trench step height (i.e., trench depth plus the thicknesses of the pad oxide and silicon nitride layer), and the reverse-tone mask 250 is then stripped. Since opening 252 exposed the sloped edges of the oxide layer as well as the flat plateau, the resulting oxide horns 248*a* are smaller than the corresponding prior art oxide horns 148*a* of FIG. 1D.

Figure 2E:
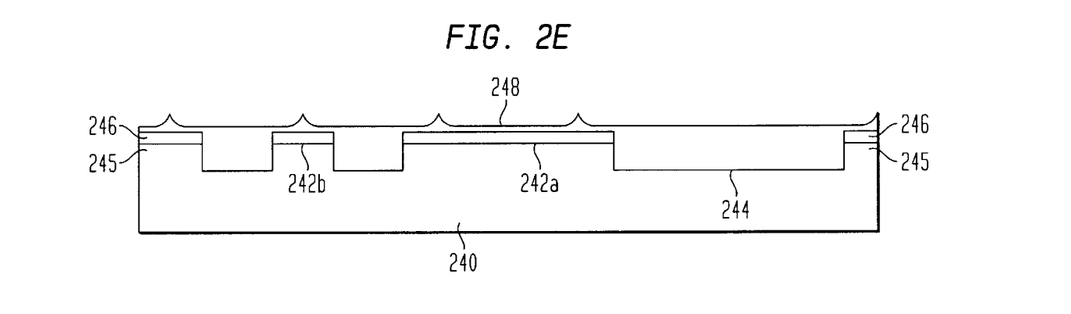
Figure 2F:
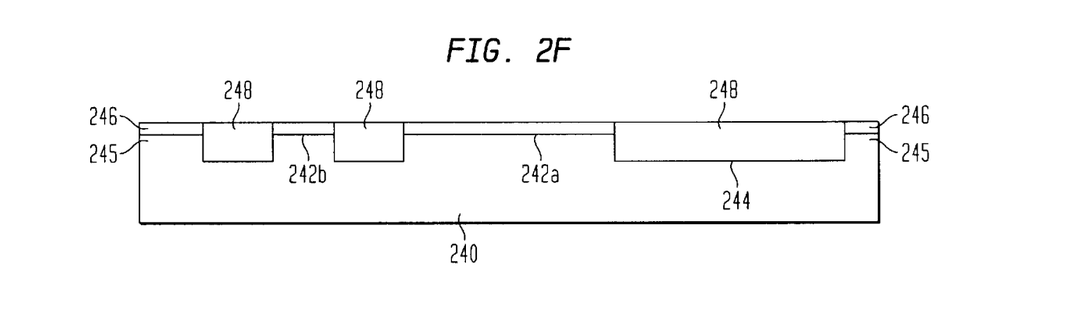

In FIG. 2E, a wet-etching step (e.g., immersion in a hydrofluoric (HF) acid) is applied to reduce the sizes of all of the oxide horns (i.e., 248*a* and 248*b*) as well as the overall thickness of the oxide layer. After the wet-etching of FIG. 2E, chemical-mechanical polishing is applied (FIG. 2F) to remove the remaining oxide horns and planarize the oxide layer. The silicon nitride layer 246 acts as an etch stop, so that the oxide layer 248 within each shallow trench 244 has the same level as the silicon nitride layer 246.

Compared to the prior art, the STI process described in FIGS. 2A–F has a shorter overall CMP processing time. The sputter etch-back step of FIG. 2B, the greater exposure of the oxide layer in FIG. 2C for the reverse-tone etching of FIG. 2D, and the additional wet-etching step of FIG. 2E combine to substantially decrease the size of the oxide horns as well as the overall thickness of the oxide layer. As such, the CMP processing time needed to remove the oxide horns is reduced. Moreover, the overall burden on the CMP processing is reduced, because, compared to the prior art, in the present invention, the CMP processing is required to planarize only a relatively thin oxide layer. As a result, the post-CMP uniformity of the wafer will typically be improved.

Figure 3:
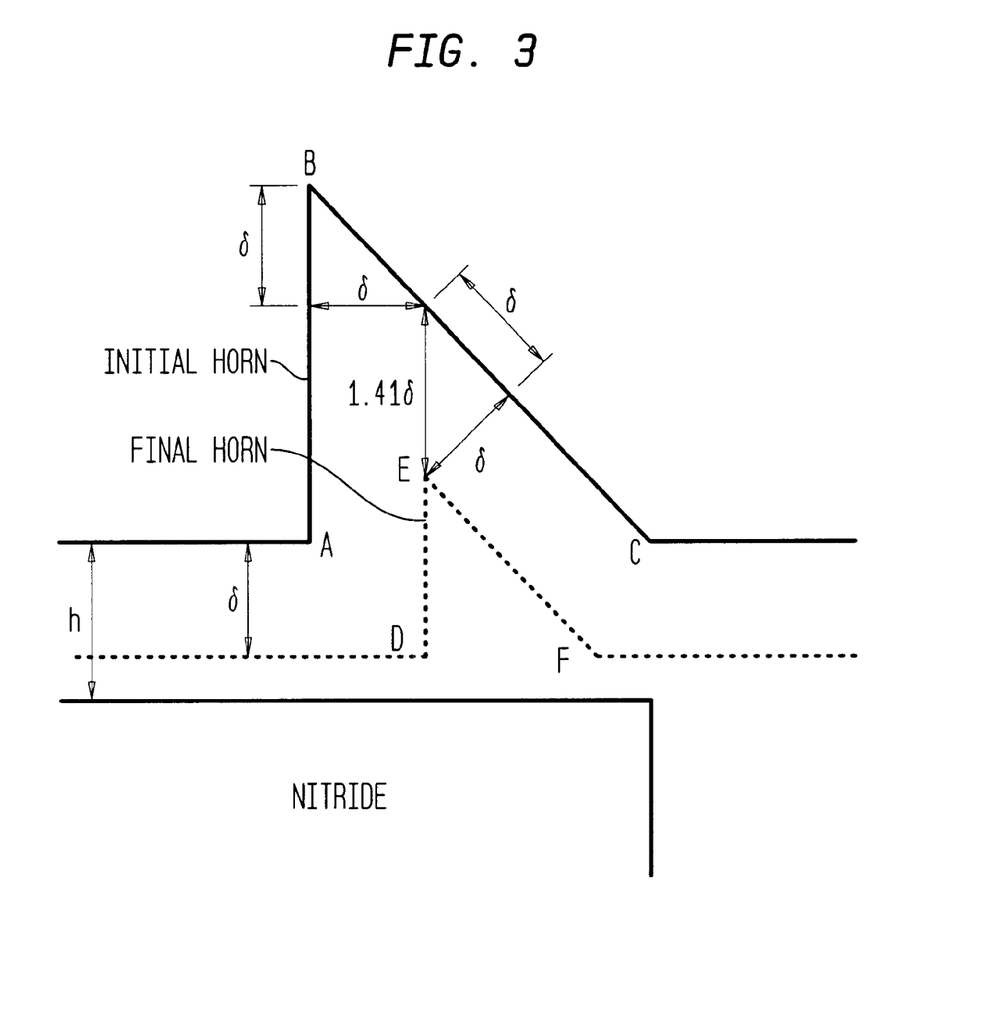
FIG. 3 is a graphical representation of the reduction of horn size by wet-etching during formation of STI structures.

FIG. 3 shows how horn size is reduced by wet-etching of the oxide layer. As depicted in FIG. 3, a geometrical analysis shows that when the oxide is layer is reduced by an amount 8, horn size is decreased by about 1.41 times 6. For example, if the oxide layer above the silicon nitride layer is about is about 2500 Å thick, the horn size will be around 3000–4000 Å high. By performing wet-etching (as in FIG. 2E) to remove an amount 6 equal to about 2000 Å, prior to CMP processing, the oxide layer is reduced to about 500 Å, and a 4000 Å horn will be decreased to about 1200 Å (i.e., 4000 Å minus 1.41*2000 Å), a 70% reduction in horn height. Similar wet-etching will decrease a 3500 Å horn to about 700 Å (e.g., 3500 Å minus 1.41*2000 Å), an 80% reduction in horn height.

Due to the reduction in both horn height and overall thickness of the oxide layer, final oxide removal and planarization (of FIG. 2F) can be achieved with a shorter CMP processing time. In the case of wet-etching, the CMP processing time can be decreased from about 95 seconds to about 30 seconds.

Figure 4A:
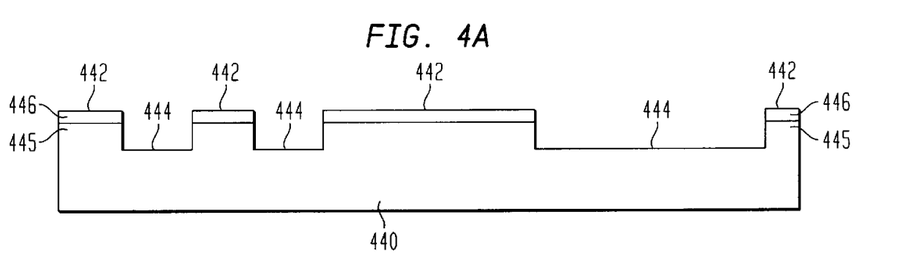
FIGS. 4A–E are cross-sectional views showing a method of forming STI structures, in accordance with a second embodiment of the present invention.
Figure 4B:
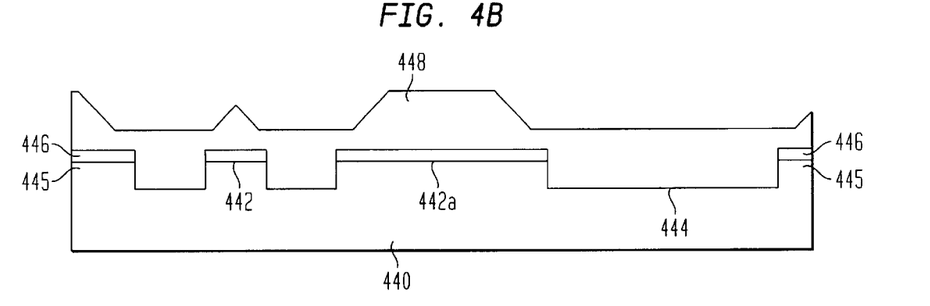
Figure 4C:
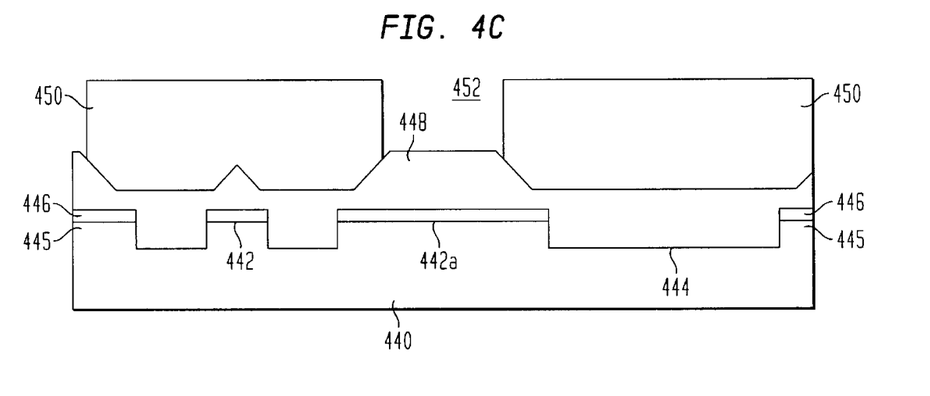
Figure 4D:
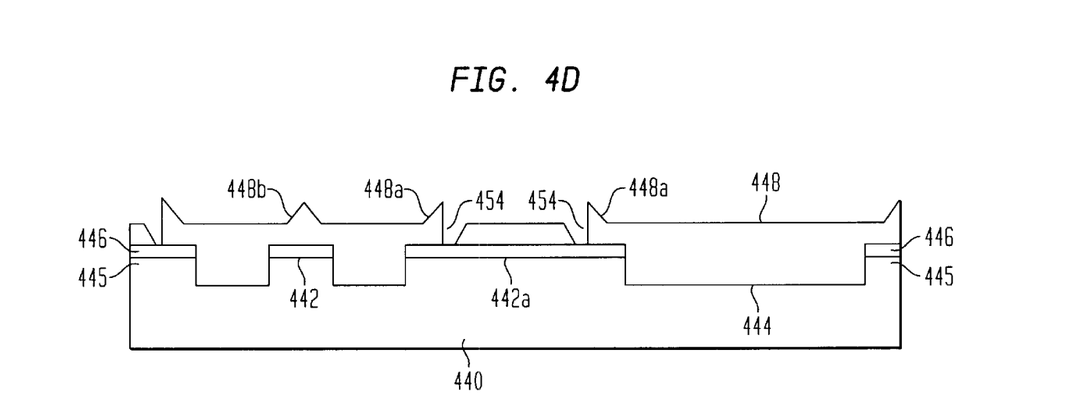
Figure 4E:
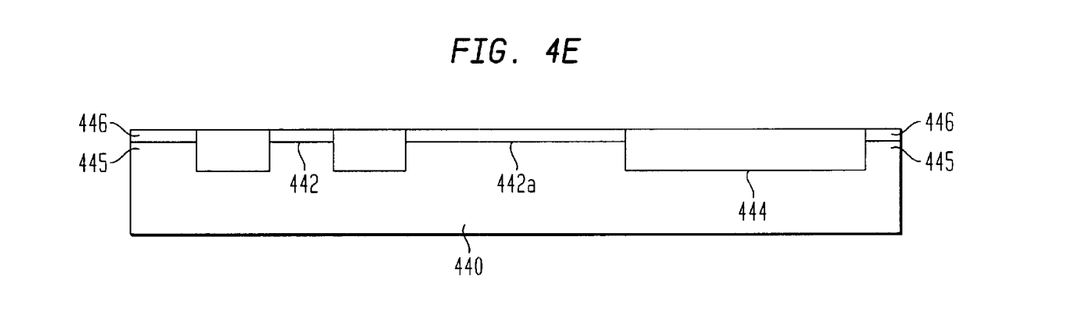

Referring now to the STI process of FIGS. 4A–E, as in the STI process of FIGS. 2A–F, SEB is applied to pull back the sloped edges of the oxide structures (FIG. 4B) and the reverse-tone mask exposes part of the sloped edges of the large oxide structures (FIG. 4C). In this method, instead of an additional wet-etching step (e.g., FIG. 2E), the reverse-tone dry-etching step of FIG. 4D is performed with a highly selective chemistry that removes silicon oxide, but does not significantly affect silicon nitride. As a result, the silicon nitride layer 446 acts as an etch stop during this dry-etching step, and the exposed oxide layer 448 within opening 452 can be etched all the way down to the silicon nitride layer, as indicated by openings 454 in FIG. 4D.

Furthermore, since the dry-etch is highly selective, the oxide layer 448 of FIG. 4B can be originally applied at a significantly smaller thickness. For example, the oxide layer 448 can be applied at a thickness of about 1 kÅ above the shallow trench height. As such, instead of a typical oxide thickness of about 7 kÅ, the oxide layer 448 of FIG. 4B can be applied at a thickness about 5 kÅ, if not smaller.

The key to the "stop on nitride" RTOX process is its ability to maintain high (~20:1) etch rate selectivity of SiO2 with respect to Si3N4 over a modest range of feature aspect ratios. Present technologies have an aspect ratio range of 0—1 for the RTOX features. Advanced technologies may require an aspect ratio upper limit in the range 2–3. For high oxide:nitride selective processes, there is typically a tradeoff between high selectivity and the range of aspect ratios over which the desired selectivity can be maintained without encountering an etch-stop condition. Etch stop occurs when, at certain aspect ratios, the polymer deposition rate exceeds the oxide etch rate and the etching process terminates prematurely. In order to meet the requirements of the RTOX process, a chemistry which normally has modest selectivity of oxide to nitride and which has very good aspect ratio independence of its etch characteristics was modified to obtain a higher oxide:nitride selectivity. The resultant process met the selectivity specifications and avoided etch stop across the necessary range of aspect ratios.

In one implementation of the present invention, the dry-etch is performed using the TEL DRM etch tool from Tokyo Electron, Ltd., of Tokyo, Japan. One possible recipe for the dry-etch using this particular etch tool is given as follows:

Duration: ~75 seconds

Electrode spacing: ~27 millimeters

Chamber pressure: 50±5 millitorr

Lower RF power: 1500±100 watts

Gases:
  Ar: 400±40 sccm (standard cubic centimeters per minute)
  CO: 300±30 sccm
  $C_4F_8$: 16±2 sccm Edge He pressure: 40±5 torr Center He pressure: 7±2 torr Temperatures:
  Upper electrode: 60±5 C.
  Wall: 60±5 C.
  Lower electrode: 40±15 C. In alternative recipes, other suitable gases can be substituted for the $C_4F_8$, include (for example and without limitation) $C_5F_8$, $C_4F_6$, or a combination of $C_4F_8$ and $CH_2F_2$. Those skilled in th understand that these (and other) possible alternative recipes may involve different values for some or all of the above parameters. It will also be understood that recipes may be implemented with or without CO and/or with or without dilution using Ar or other suitable noble gas, depending on the particular etch tool used.

The preferred dry-etch has a selectivity greater than about 50:1. Therefore, even though the thickness of the oxide layer 448 is relatively thin when compared to the prior art, high selectivity etching ensures that the nitride layer 446 is not harmed in the regions 454 where nitride is exposed to the dry-etch plasma. Note that the STI process of FIGS. 4A–E is an entirely dry process that has no wet-etching steps prior to CMP.

As with the STI process of FIGS. 2A–F, the STI process of FIGS. 4A–E enables a shorter CMP processing time and an improved post-CMP uniformity than provided by the prior art. These advantages result from the thinner oxide layer of FIG. 4B, the SEB step of FIG. 4B, the greater exposure of the oxide layer in FIG. 4C for the reverse-tone etching of FIG. 4D, and the improved selectivity of the reverse-tone dry-etch of FIG. 4D, which enables the silicon oxide layer to be removed down to the silicon nitride layer.

Referring now to the STI process of FIGS. 5A–F, as in the STI process of FIGS. 4A–F, a thinner oxide layer is originally applied (FIG. 5B), SEB is applied to pull back the sloped edges of the oxide structures (FIG. 5B), and the highly selective dry-etch is used to remove the exposed oxide layer (FIG. 26 SE). In this method, an additional wet-etching step (e.g., immersion in an HF acid) is applied (FIG. 5C) to reduce the size of all of the oxide structures as well as the overall thickness of the oxide layer prior to the application of the reverse-tone mask of FIG. 5D. The wet-etching preferably decreases the oxide horns on top of narrow active regions (less than about 0.9 micron in width) to less than 800 Å, as well as reduces the overall thickness of the oxide layer by about 2000 Å.

Figure 5A:
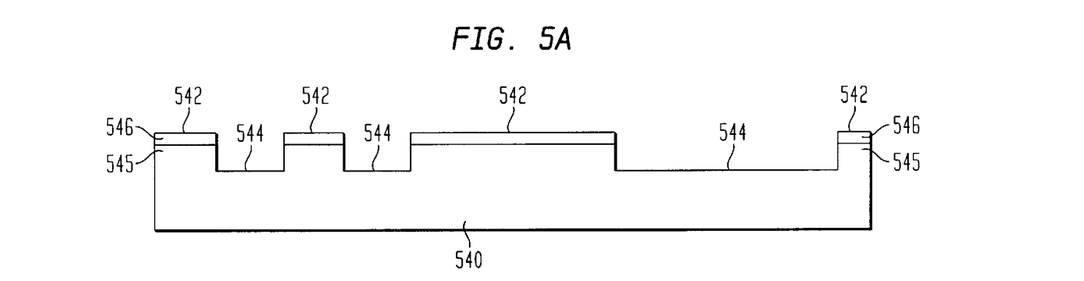
FIGS. 5A–F are cross-sectional views showing a method of forming STI structures, in accordance with a third embodiment of the present invention.
Figure 5B:
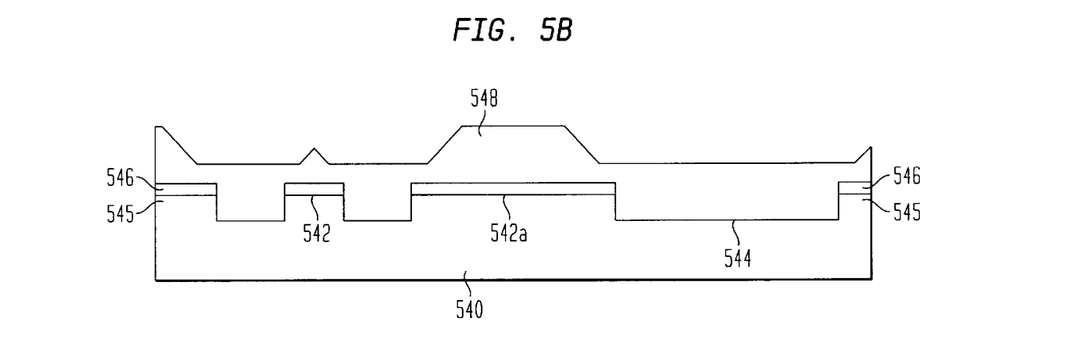
Figure 5C:
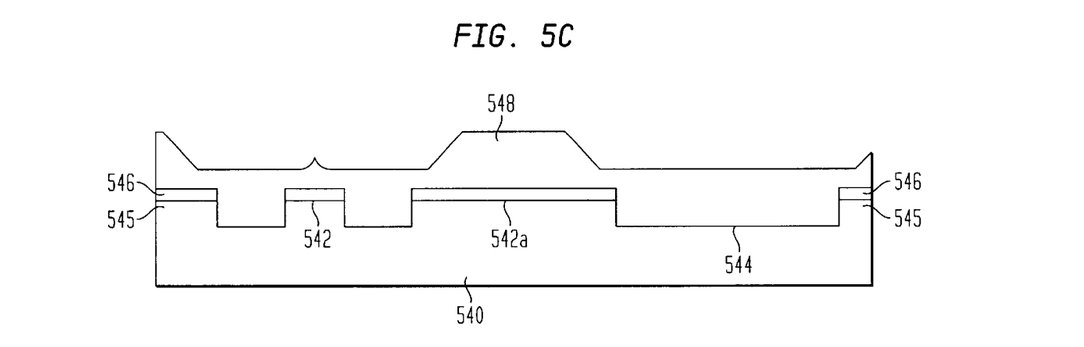
Figure 5D:
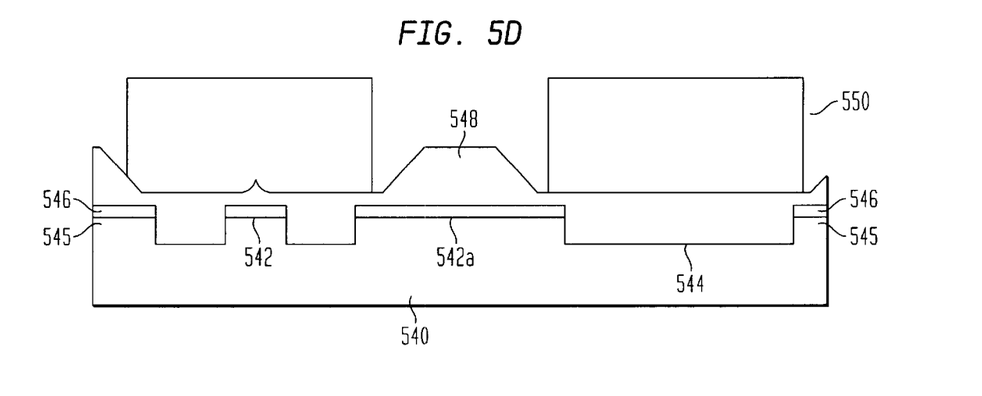
Figure 5E:
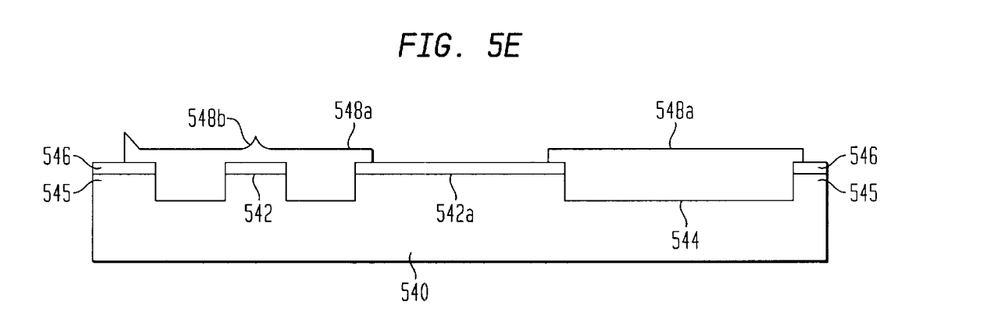
Figure 5F:
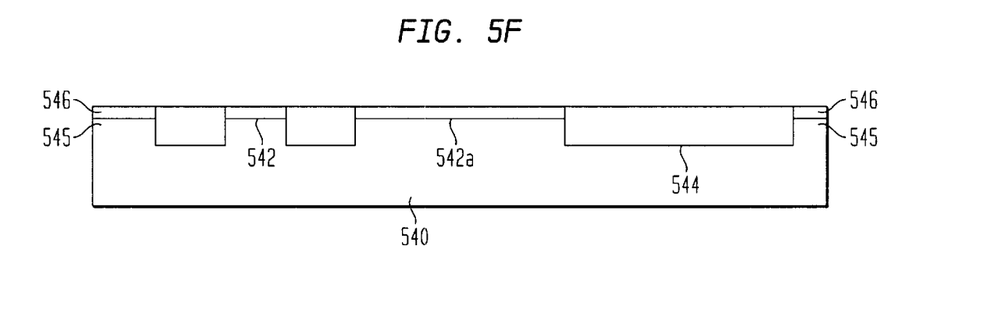

As a result of the further reduction in the size of the oxide structures, the reverse-tone mask 550 can have openings that expose the entire oxide structures over large active regions (as opposed to exposing the plateaus and only part of the sloped edges of those structures as in FIGS. 2C and 4C). As such, the highly selective dry-etch can be used to remove the entire exposed oxide structure all the way down to the nitride layer before the reverse-tone mask is stripped, as indicated in FIG. 5E.

As with the STI processes of FIGS. 2A–F and 4A–E, the STI process of FIGS. 5A–F enables a shorter CMP processing time and an improved post-CMP uniformity than provided by the prior art. These advantages result from the thinner oxide layer of FIG. 5B, the SEB step of FIG. 5B, the additional wet-etching step of FIG. 5C, the even greater exposure of the oxide structures in FIG. 5D for the reverse-tone etching of FIG. 5E, and the improved selectivity of the reverse-tone dry-etch of FIG. 5E, which enables the entire exposed oxide structures to be removed all the way down to the silicon nitride layer.

Those skilled in the art will understand that the present invention can be implemented with other possible combinations of the various oxide-removal steps described in the STI processes of FIGS. 2, 4, and 5. Moreover, certain of these steps can be modified. For example, the wet-etching steps can be performed using chemicals other than HF acid.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A method for forming shallow-trench isolation (STI) structures during semiconductor processing, comprising the sequence of steps of:
    (a) forming shallow trenches in a substrate;
    (b) applying a silicon oxide layer onto the substrate;
    (c) applying a reverse-tone mask over the silicon oxide layer, wherein the reverse-tone mask has openings that expose the silicon oxide layer corresponding to large active regions of the substrate;
    (d) dry-etching the silicon oxide layer exposed through the openings in the reverse-tone mask;
    (e) stripping the reverse-tone mask; and
    (f) performing chemical-mechanical polishing (CMP) to generate a planarized substrate having STI structures, wherein wet-etching is performed prior to the CMP polishing to reduce the sizes of oxide structures in the silicon oxide layer, wherein the wet-etching is performed between steps (b) and (c).

2. The invention of claim 1, wherein the wet-etching is also performed between steps (e) and (f).

3. The invention of claim 1, wherein the wet-etching is performed using a hydrofluoric (HF) acid.

4. The invention of claim 1, further comprising the step of performing a sputter etch-back (SEB) step prior to step (c) to pull back sloped edges in the silicon oxide layer.

5. The invention of claim 1, wherein the openings in the reverse-tone mask expose at least part of each sloped edge of the silicon oxide layer exposed through the reverse-tone mask.

6. The invention of claim 5, wherein the openings in the reverse-tone mask expose all of each sloped edge of the silicon oxide layer exposed through the reverse-tone mask.

7. The invention of claim 1, wherein the dry-etching is performed with a highly selective chemistry that enables at least part of the silicon oxide layer exposed through the openings in the reverse-tone mask to be removed all the way down to a silicon nitride layer of the substrate that is under the silicon oxide layer.

8. The invention of claim 7, wherein the dry-etch removes substantially all of the silicon oxide layer exposed through the openings in the reverse-tone mask.

9. The invention of claim 7, wherein step (b) comprises the step of applying the silicon oxide layer at a thickness of no more than about 1 kÅ greater than the depth of the shallow trenches.

10. The invention of claim 7, wherein the highly selective chemistry comprises a carbon-fluoride gas, CO, and a noble gas.

11. A method for forming shallow-trench isolation (STI) structures during semiconductor processing, comprising the sequence of steps of:
    (a) forming shallow trenches in a substrate;
    (b) applying a silicon oxide layer onto the substrate;
    (c) performing a sputter etch-back to pull back sloped edges in the silicon oxide layer;
    (d) applying a reverse-tone mask over the silicon oxide layer, wherein the reverse-tone mask has openings that expose the silicon oxide layer corresponding to large active regions of the substrate;
    (e) dry-etching the silicon oxide layer exposed through the openings in the reverse-tone mask;
    (f) stripping the reverse-tone mask; and
    (g) performing chemical-mechanical polishing (CMP) to generate a planarized substrate having STI structures.

12. The invention of claim 11, wherein wet-etching is performed between steps (b) and (d).

13. The invention of claim 11, wherein wet-etching is performed between steps (f) and (g).

14. The invention of claim 11, wherein the openings in the reverse-tone mask expose at least part of each sloped edge of the silicon oxide layer exposed through the reverse-tone mask.

15. The invention of claim 14, wherein the openings in the reverse-tone mask expose all of each sloped edge of the silicon oxide layer exposed through the reverse-tone mask.

16. The invention of claim 11, wherein the dry-etching is performed with a highly selective chemistry that enables at least part of the silicon oxide layer exposed through the openings in the reverse-tone mask to be removed all the way down to a silicon nitride layer of the substrate that is under the silicon oxide layer.

17. The invention of claim 16, wherein the dry-etch removes substantially all of the silicon oxide layer exposed through the openings in the reverse-tone mask.

18. The invention of claim 16, wherein step (b) comprises the step of applying the silicon oxide layer at a thickness of no more than about 1 kÅ greater than the depth of the shallow trenches.

19. The invention of claim 16, wherein the highly selective chemistry comprises a carbon-fluoride gas, CO, and a noble gas.

* * * * *

UNITED STATES PATENT AND TRADEMARK OFFICE
Certificate

Patent No. 6,372,605 B1

Patented: April 16, 2002

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Stephen C. Kuehne, Orlando, FL; Alvaro Maury, Orlando, FL; Scott F. Shive, Orlando, FL; Mahjoub A. Abdelgadir, Orlando, FL; Patrick E. Brown, Orlando, FL; and Gerald W. Gibson, Jr., Orlando, FL.

Signed and Sealed this Third Day of August 2004.

CARL WHITEHEAD, JR.
*Supervisory Patent Examiner*
*Art Unit 2813*